United States Patent
Ogihara et al.

(10) Patent No.: US 7,247,888 B2
(45) Date of Patent: Jul. 24, 2007

(54) FILM FORMING RING AND METHOD OF MANUFACTURING SEMICONDUCTOR DEVICE

(75) Inventors: Hirotaka Ogihara, Oita (JP); Yukio Nishiyama, Yokohama (JP); Akio Ui, Tokyo (JP); Takashi O, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 11/067,640

(22) Filed: Feb. 28, 2005

(65) Prior Publication Data

US 2005/0191811 A1 Sep. 1, 2005

(30) Foreign Application Priority Data

Mar. 1, 2004 (JP) ............................. 2004-056453

(51) Int. Cl.
*H01L 29/74* (2006.01)
*H01L 31/111* (2006.01)

(52) U.S. Cl. ............... 257/170; 257/484; 257/E21.001; 257/E21.17; 438/140

(58) Field of Classification Search ............... 257/170, 257/484, 701, 702, 721, 914, 639, 759, 760
See application file for complete search history.

(56) References Cited

U.S. PATENT DOCUMENTS

| | | | | |
|---|---|---|---|---|
| 5,529,657 A | * | 6/1996 | Ishii | ................. 156/345.26 |
| 5,792,304 A | * | 8/1998 | Tamura et al. | ......... 156/345.27 |
| 5,868,848 A | * | 2/1999 | Tsukamoto | ............. 118/723 E |
| 6,117,349 A | * | 9/2000 | Huang et al. | ................. 216/71 |
| 6,344,105 B1 | | 2/2002 | Daugherty et al. | |
| 6,723,202 B2 | | 4/2004 | Nagaiwa et al. | |
| 2002/0038691 A1 | | 4/2002 | Hayakawa | |

FOREIGN PATENT DOCUMENTS

| | | |
|---|---|---|
| JP | 07-106316 | 4/1995 |
| JP | 8-167595 | 6/1996 |
| JP | 2001-007090 | 1/2001 |
| JP | 2002-110646 | 4/2002 |
| JP | 2002-241946 | 8/2002 |

OTHER PUBLICATIONS

Notification of Reasons for Rejection mailed May 9, 2006, issued by the Japanese Patent Office in counterpart Japanese Application No. 2004-056453 and English translation thereof.

* cited by examiner

*Primary Examiner*—David Nhu
(74) *Attorney, Agent, or Firm*—Finnegan, Henderson, Farabow, Garrett & Dunner, L.L.P.

(57) ABSTRACT

There is here disclosed a film forming ring including a ring main body being made of an insulating material and formed in an annular shape along an edge of a substrate on which a film forming process by using a material gas in a plasma state is applied, and an inner rim of the ring main body being formed higher than its outside portion.

17 Claims, 5 Drawing Sheets

FILM FORMING RING AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-056453, filed Mar. 1, 2004, the entire contents of which are incorporated herein by reference.

BACKGROUND OF THE INVENTION

1. Field of the Invention

The present invention relates to a technology of forming a thin film in process of manufacturing a semiconductor device, and more particularly to a film forming ring capable of improving the burying characteristic when burying a fine recess of high aspect ratio with a thin film and a method of manufacturing a semiconductor device.

2. Description of the Related Art

Recently, in the trend of smaller size and higher density of a semiconductor element, there is an increasing demand for burying technology (thin film forming technology) having excellent burying characteristic, capable of burying a fine recess of high aspect ratio with a thin film without forming voids in the inside thereof. To meet such a need, for example, a so-called plasma CVD apparatus is being used. The technology relating to the plasma CVD apparatus is disclosed in, for example, Jpn. Pat. Appln. KOKAI Publication Nos. 7-106316, 2001-7090, 2002-241946, and 2002-110646. The plasma CVD apparatus is capable of ionizing components of a film forming material (material gas) in the plasma state, and applying bias to a semiconductor substrate. Accordingly, components of the ionized film forming material in the plasma state are attracted aggressively to the substrate, so that a thin film such as a silicon oxide insulating film can be formed on the substrate. More specifically, when forming a shallow trench isolation (STI) region on a substrate, a thin film of a silicon oxide film ($SiO_2$ film) is formed in a recess formed in a surface layer of the substrate by using a high density plasma (HDP) type CVD apparatus.

When burying the recess formed in the surface layer of the substrate or above the substrate by a plasma CVD apparatus, the following phenomenon is observed in the recess of the edge area of the substrate in the midst of burying. After a film of $SiO_2$ once depositing on the upper side of the recess, for example, in a certain portion of an inner wall of the recess near the opening of the recess, is mostly peeled off by the sputtering action of the plasma CVD apparatus, the film deposits again at a portion opposite to the portion of the inner wall of the recess. That is, when the $SiO_2$ film is formed by using the plasma CVD apparatus, deposition of the $SiO_2$ film and sputtering take place in parallel. As a result, an overhang portion formed of the $SiO_2$ film is formed near the opening of the recess in the burying. The overhang portion grows along with the progress of the $SiO_2$ film forming process, that is, the recess burying process, until the opening of the recess is closed. Thus, the overhang portion formed near the opening of the recess is a cause of formation of voids in the recess. In other words, the overhang portion near the opening of the recess causes to lower the burying characteristic of the recess in the edge area of the substrate.

In the edge area of the substrate, most voids formed in the recess after burying of the recess are asymmetrical to the radial direction of the recess in a longitudinal view. This is because the material gas in the edge area of the substrate is different from the center part of the substrate in the incident direction into the recess. More specifically, in the edge area of the substrate, components of ionized material gas in the plasma state enter the recess obliquely from above toward the radial outer side of the substrate from the center part side of the substrate. Such incidence of the material gas into the recess obliquely from above is a cause of forming easily the overhang portion near the opening of the recess in the edge area of the substrate. It is also one of the causes of lowering the burying characteristic of the recess in the edge area of the substrate. In the central part of the substrate, meanwhile, such a problem hardly occurs because the material gas enters the recess substantially from right above. Thus, when burying the recess formed in the substrate or above the substrate with a thin film by using a plasma CVD apparatus, generally, the burying characteristic is poor in the edge area of the substrate as compared with the central part of the substrate.

Further, when voids are formed in the recess, the quality, performance and yield of the semiconductor substrate are lowered, and the manufacturing cost soars. As a result, the quality, performance and yield of the semiconductor device having such a semiconductor substrate are lowered, and the manufacturing cost hikes up.

BRIEF SUMMARY OF THE INVENTION

According to an aspect of the invention, there is provided a film forming ring comprising: a ring main body being made of an insulating material and formed in an annular shape along an edge of a substrate on which a film forming process by using a material gas in a plasma state is applied, and an inner rim of the ring main body being formed higher than its outside portion.

According to another aspect of the invention, there is provided a method of manufacturing a semiconductor device comprising: arranging a semiconductor substrate on which a film forming process by using a material gas in a plasma state is applied on a substrate supporter provided in a processing container, and mounting a film forming ring so as to be set an inner rim of a ring main body of the film forming ring being along an edge of the semiconductor substrate and an upper surface of the inner rim being positioned at a height equal to or lower than a principal plane of a side of the semiconductor substrate on which the film forming process is applied; supplying the material gas for use in the film forming process into the processing container; and generating the plasma state of the material gas in the processing container by applying a voltage to the material gas supplied in the processing container; wherein the ring main body is made of an insulating material and formed in an annular shape along the edge of the semiconductor substrate, and the inner rim is formed higher than its outside portion.

According to still another aspect of the invention, there is provided a method of manufacturing a semiconductor device, comprising: supplying a material gas to a principal plane of a side of a semiconductor substrate on which a film forming process by using the material gas in a plasma state is applied, with forming an electric field having an equipotential surface near an edge of the semiconductor substrate, from above the principal plane of the semiconductor substrate toward a downward of the principal plane along a surface of the semiconductor substrate.

DETAILED DESCRIPTION OF THE INVENTION

Figure 1:
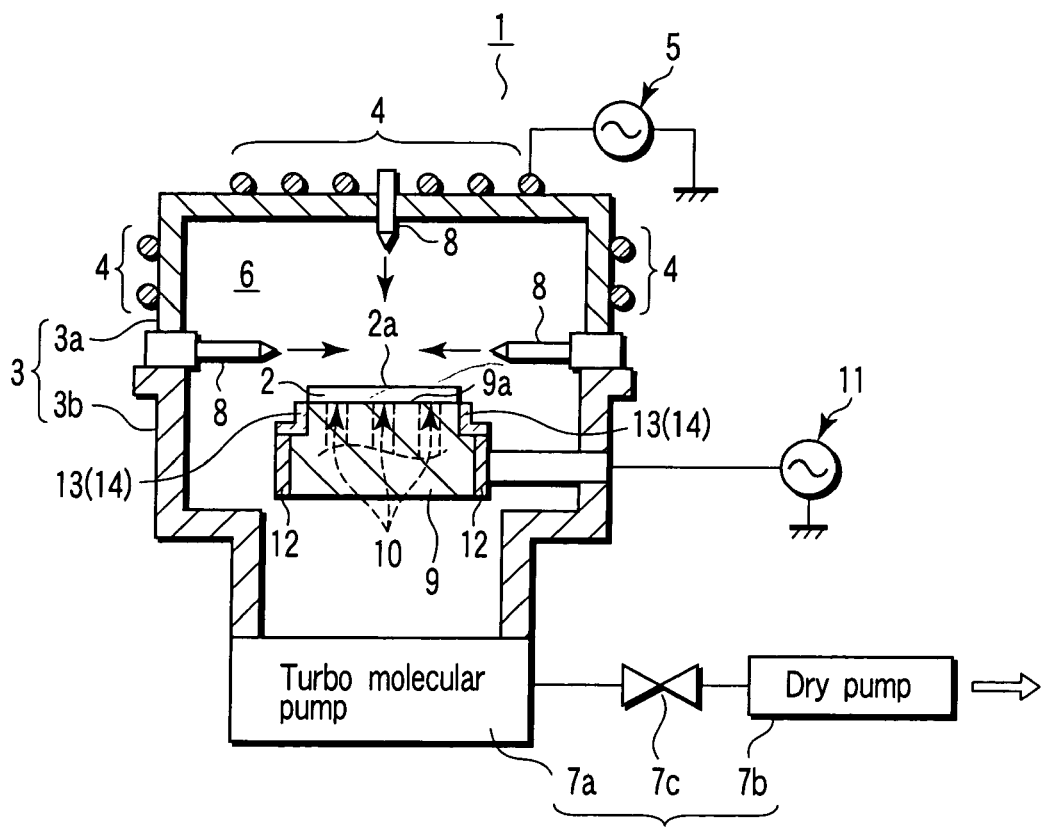
FIG. 1 is a simplified sectional view showing a semiconductor device manufacturing apparatus according to a first embodiment of the invention.

The invention will be specifically described below by referring to embodiments shown in the drawings.

(First Embodiment)

Figure 2:
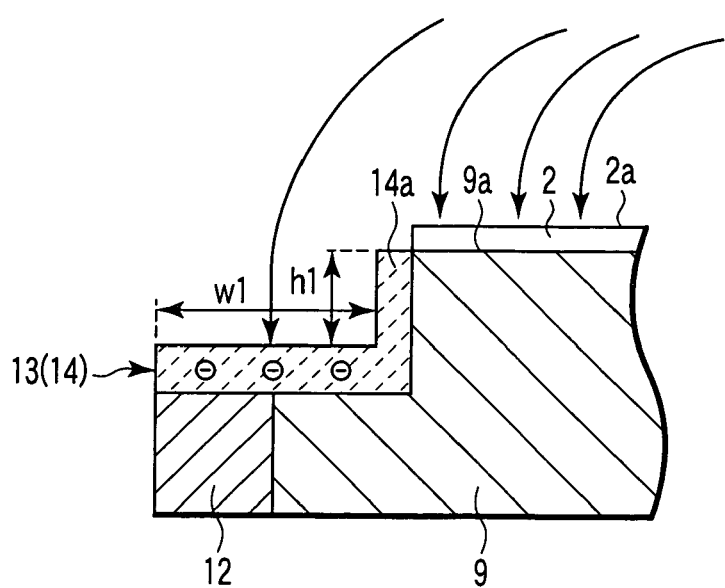
FIG. 2 is an enlarged sectional view showing a film forming ring and an edge area of a semiconductor substrate of the semiconductor device manufacturing apparatus shown in FIG. 1.
Figure 3A:
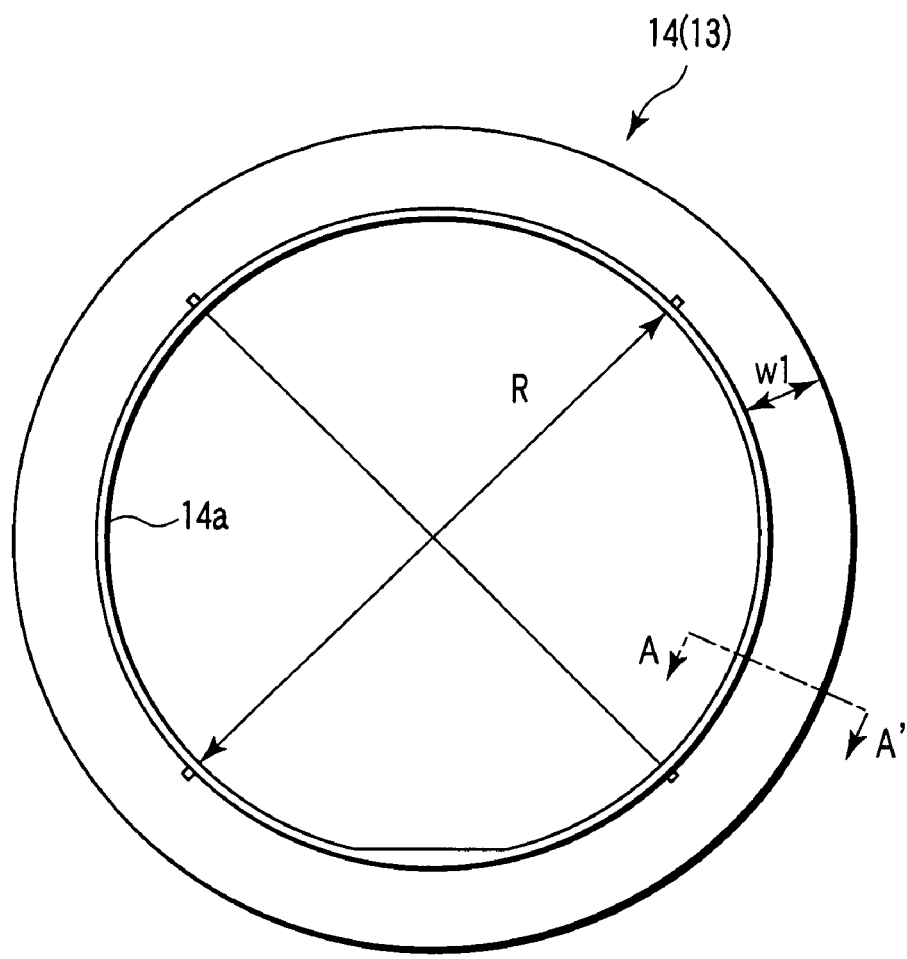
FIG. 3A is a plan view seen from above the film forming ring according to the first embodiment.
Figure 3B:
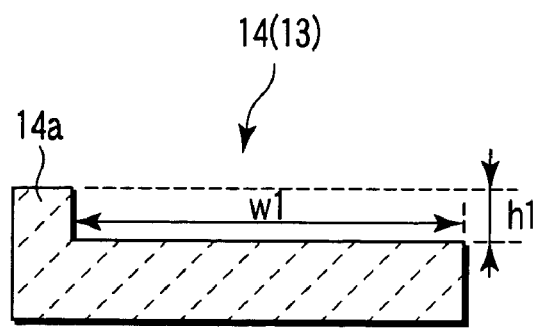
FIG. 3B is a sectional view taken along broken line A–A' in FIG. 3A.

A first embodiment of the invention will be described by referring to FIGS. 1 to 3B. FIG. 1 is a simplified sectional view showing a semiconductor device manufacturing apparatus according to this embodiment. FIG. 2 is an enlarged sectional view showing a film forming ring and an edge area of a semiconductor substrate of the semiconductor device manufacturing apparatus shown in FIG. 1. FIG. 3A is a plan view seen from above the film forming ring according to the embodiment. FIG. 3B is a sectional view taken along broken line A–A' in FIG. 3A.

The present embodiment relates to a film forming technology for burying a substrate or a fine recess (groove, step) of high aspect ratio formed in the substrate or above the substrate by using a predetermined film without forming voids practically in the inside of the recess. For example, it relates to a film forming technology for burying a groove which becomes a shallow trench isolation (STI) region with a $SiO_2$ film without allowing a gap practically by using a high density plasma (HDP) type CVD apparatus. Specifically, a film forming ring provided on a substrate supporter for supporting a semiconductor substrate so as to surround the semiconductor substrate is formed in a shape so as to suppress oblique incidence of a material gas (film forming material) in the plasma state toward the semiconductor substrate near the edge area of the semiconductor substrate. More specifically, a space, in which an electric field can be generated such that components of an ionized material gas (film forming material) in the plasma state enter substantially vertically toward the semiconductor substrate near the edge area of the semiconductor substrate, is provided around the film forming ring. As a result, vertical components along the normal direction of a principal plane, of the incident direction of the material gas toward the principal plane of the side of the semiconductor substrate on which film forming process is applied, are increased near the edge area of the semiconductor substrate, thereby improving the burying characteristic. A detailed description is given below. In the following explanation, components of the ionized material gas in the plasma state are merely referred to as material gas in the plasma state.

Referring first to FIG. 1, a semiconductor device manufacturing apparatus 1 according to the embodiment will be described. The semiconductor device manufacturing apparatus 1 is specifically a kind of film forming apparatus, that is, an HDP-CVD apparatus of an induction coupled plasma (ICP) system. A silicon oxide film ($SiO_2$ film) is formed on a semiconductor substrate 2 by using the ICP system HDP-CVD apparatus 1.

As shown in FIG. 1, the CVD apparatus 1 accommodates the semiconductor substrate (Si wafer) 2 on which film forming process is applied, and also comprises a processing container 3 to which a material gas for use in film forming process is supplied. The processing container (reaction vessel) 3 is composed of a ceramic dome portion 3a as an upper part of the container, and a metal chamber portion 3b as a lower part of the container. An antenna 4 is wound around the ceramic dome portion 3a. A terminal of the antenna 4 is connected to a first RF power supply 5 as a power source for generating plasma. By operating the first RF power supply 5, electric power is supplied into a space (processing chamber 6) in the processing container 3 via the antenna 4, and voltage is applied to the material gas supplied in the processing chamber 6. As a result, components of the material gas in the processing chamber 6 causes induction coupling, and the material gas in the plasma state is generated. Note that the antenna 4 is grounded via the first RF power supply 5.

The metal chamber portion 3b is provided with an atmosphere setting device 7 for exhausting the material gas in the processing chamber 6 to outside of the processing chamber 6, or setting the pressure in the processing chamber 6 to a predetermined value. The atmosphere setting device 7 of the embodiment is composed of a turbo molecular pump 7a connected to the lower end of the metal chamber portion 3b, a dry pump 7b connected to the turbo molecular pump 7a, and an exhaust valve 7c provided between the turbo molecular pump 7a and the dry pump 7b. As indicated by blank arrow in FIG. 1, by operating the atmosphere setting device 7, the material gas in the processing chamber 6 is exhausted outside of the processing chamber 6, and the processing chamber 6 may be evacuated in a vacuum state.

Further, the processing container 3 also includes a plurality of gas-injection nozzles 8 as a gas-injection section for injecting the material gas or the like into the processing chamber 6. $SiH_4$ gas or $O_2$ gas as material gas, or Ar gas as purge gas is supplied into the processing chamber 6 via each gas-injection nozzle 8. Specifically, the material gas or purge gas for use in film forming process is supplied through each gas-injection nozzle 8 onto a principal plane (surface to be processed) 2a of the side of the Si wafer 2 contained in the processing chamber 6 on which film forming process is applied as indicated by solid arrow in FIG. 1.

The processing chamber 6 accommodates a substrate supporter 9 for supporting the Si wafer 2. In the embodiment, the substrate supporter 9 is a so-called E-chuck or electrostatic chuck, and it attracts the Si wafer 2 by electrostatic force. The E-chuck 9 has a plurality of cooling holes 10 for cooling the Si wafer 2. As indicated by broken line arrow in FIG. 1, from each cooling hole 10, a cooling medium such as He gas is introduced between the Si wafer 2 attracted by the E-chuck 9 and an attracting surface 9a of the E-chuck 9. Therefore, the Si wafer 2 attracted by the E-chuck 9 is cooled efficiently regardless of the atmosphere in the processing chamber 6, and the film forming capacity of the CVD apparatus 1 can be enhanced. That is, the burying characteristic of the recess (groove, step) by the CVD apparatus 1 can be enhanced.

A second RF power supply 11 for applying self-bias is connected to the E-chuck 9. The second RF power supply 11 is connected to the E-chuck 9 via an electrode 12 provided on the outer periphery of the E-chuck 9. The electrode 12 is grounded via the second RF power supply 11, and it is also known as a substrate grounding electrode. The electrode 12 is formed of, for example, aluminum.

The E-chuck 9 further supports a film forming ring 13 described later, as shown in FIGS. 1 and 2. The film forming ring 13 is attached to the E-chuck 9 so as to surround the Si wafer 2 attracted by the E-chuck 9 from its outer side. The film forming ring 13 is formed of an insulating material. Therefore, when plasma is generated in the processing chamber 6, the film forming ring 13 is charged negatively, and an electric field (equipotential surface) is generated along its surface. Accordingly, the material gas in the plasma state generated in the processing chamber 6 is converged toward an upper side 2a of the Si wafer 2 positioned inside of the film forming ring 13. That is, the material gas in the plasma state can be converged toward the surface to be processed (upper side) 2a of the Si wafer 2. The film forming ring 13 is also referred to as a focus ring. The film forming ring 13 of this embodiment will be specifically described below.

As shown in FIG. 3A, the film forming ring 13 of the embodiment is formed in an annular shape along the edge area of the Si wafer 2. Specifically, the film forming ring 13 is composed of only a ring main body 14 formed in an annular shape along the edge area of the Si wafer 2. As shown in FIGS. 1, 2 and 3B, the ring main body 14 is formed in an L-shape in its sectional view, with an inner rim (inside wall) 14a higher than the outside portion thereof. More specifically, the ring main body 14 is formed so that the difference in height between the upper surface of the inner rim 14a and the upper surface of the outside portion of the inner rim 14a indicated by h1 in FIGS. 2 and 3B is about 3.5 mm. At the same time, the width from the outer side of the inner rim 14a and the outer rim (outer periphery) of the ring main body 14 indicated by w1 in FIGS. 2, 3A, and 3B is about 38 mm. That is, the height h1 of the inner rim 14a of the ring main body 14 is at 1/11 or more of the width w1 along the radial direction of the ring main body 14 in the outside portion of the inner rim 14a.

Thus, most of a portion in the film forming ring 13 parallel to the surface to be processed 2a of the Si wafer 2 is formed in projection toward the radial outer side of the film forming ring 13 at the position lowered by about 3.5 mm from the upper surface of the inner rim 14a of the ring main body 14. The inside diameter (inside diameter of the inner rim 14a) of the ring main body 14 indicated by R in FIG. 3A is about 198 mm. The thickness of the inner rim 14a of the ring main body 14 is set sufficiently thin as compared with the height h1 of the inner rim 14a of the ring main body 14. Further, the ring main body 14 of the embodiment is formed of an insulating ceramic material. Therefore, the film forming ring 13 of the embodiment is also referred to as a ceramic ring.

The ring main body 14 is attached to the E-chuck 9, with its inner rim 14a formed along the rim of the Si wafer 2, and the upper surface of the inner rim 14a positioned at a height equal to or lower than the surface to be processed 2a of the Si wafer 2. In the embodiment, as shown in FIGS. 1 and 2, the ring main body 14 is attached to the E-chuck 9 with the upper surface of the inner rim 14a positioned at the substantially same height as the attracting surface 9a of the E-chuck 9. That is, the ring main body 14 is attached to the E-chuck 9, with its inner rim 14a formed along the edge area of the Si wafer 2, and the upper surface of the inner rim 14a positioned at a height substantially same as the reverse side of the surface to be processed 2a of the Si wafer 2.

As explained in the prior art, when forming a silicon oxide film by using the high density plasma CVD apparatus, depositing of the silicon oxide film and sputtering take place in parallel. As a result, the silicon oxide film once depositing on the upper side of recess, groove opening or step formed on the surface layer of the substrate or above the substrate is sputtered, and is adhered again to the side wall of the side opposite to the depositing position. Hence, an overhang portion formed from a silicon oxide film is formed on the upper side of recess, groove opening or step. In particular, at the edge area of the wafer (wafer rim portion), different from the center part of the wafer (wafer center portion), the material gas in the plasma state enters obliquely from above the surface to be processed of the wafer, from the center part of the wafer toward the outer side in the radial direction. Accordingly, in the wafer rim portion, the overhang portion formed at the outer side in the radial direction of the wafer such as a recess and step is larger than an overhang portion formed in other positions. When film forming process continues in such an environment, in the wafer rim portion, the recess and groove opening (aperture) are easily clogged by the overhang portion. That is, in the wafer rim portion, voids are likely to be formed in the recess or groove.

When plasma is generated in the processing chamber, as mentioned above, the focus ring made of insulator is charged with electrons, and an electric field (equipotential surface) is generated along its surface. Although not shown in the drawing, a conventional focus ring is formed in a flat annular shape free of step or recess on the surface, unlike the ceramic ring 13 of the embodiment described above. Or, the conventional focus ring is formed with its inner rim lower than the outside portion, different from the ceramic ring 13 of the embodiment. By using the conventional focus ring, therefore, an electric field is generated at a height equal to or higher than the surface to be processed of the wafer, around the wafer and focus ring. Hence, near the edge area of the wafer, the material gas in the plasma state is attracted to the surface to be processed obliquely from above, from the wafer center portion side to the outer side in the radial direction. Consequently, in the wafer rim portion, the overhang portion formed at the outer side in the radial direction of the wafer such as recess and step is promoted to be larger than the overhang portion formed in other positions.

In consequence, in the wafer rim portion, the recess or groove opening is easily clogged by the overhang portion, and voids are formed easily inside. That is, by using the conventional focus ring, the burying characteristic in the recess or the like in the wafer rim portion is further lowered as compared with the burying characteristic in the recess or the like in the wafer center portion. When the burying characteristic of the recess or the like deteriorates and voids are formed inside the recess or the like, the quality, performance and yield of the wafer (semiconductor substrate) drop, and the cost of manufacturing a wafer soars. As a result, the quality, performance and yield of the semiconductor device having such a wafer are lowered, and the manufacturing cost hikes up.

By contrast, in the film forming ring 13 (ring main body 14) of the embodiment, as mentioned above, the inner rim 14a is formed higher than its outside by about 3.5 mm. The film forming ring 13 is attached to the E-chuck 9 with the upper surface of its inner rim 14a positioned at the substantially same height as the reverse side of the surface to be processed 2a of the Si wafer 2. That is, the inner rim 14a of the film forming ring 13 attached to the E-chuck 9 is close to the edge area of the wafer 2 as shown in FIG. 2, and projects in upper and lower direction by about 3.5 mm from the surface to be processed 2a along the direction orthogonal to the surface to be processed 2a of the wafer 2. At the same time, of the film forming ring 13 attached to the E-chuck 9, most of the portion parallel to the surface to be processed 2a of the Si wafer 2 projects toward the outer side in the radial direction of the Si wafer 2 and film forming ring 13, at a position lower by about 3.5 mm or more from the surface to be processed 2a of the wafer 2. When the film forming ring 13 having such a structure is applied in the HDP-CVD apparatus 1, the following phenomena are obtained.

First, when plasma is generated in the processing chamber 6, as shown in FIG. 2, the film forming ring 13 is charged with electrons. This causes an electric field (equipotential surface) (not shown) to occur so as to pass near the surface to be processed 2a of the Si wafer 2, and near the surface and inside of the film forming ring 13. As mentioned above, the inner rim 14a of the film forming ring 13 is provided by expanding its surface area in the vicinity of the edge area of the Si wafer 2, as a vertical portion extending substantially vertically and downward to the surface to be processed 2a of the Si wafer 2. Accordingly, in the vicinity of the edge of the Si wafer 2, an electric field is generated so as to be bent along the surface to be processed 2a and outer side of the Si wafer 2, and the upper surface and outer side of the inner rim 14a of the film forming ring 13. That is, the equipotential surface passes in the vicinity of the edge area of the Si wafer 2 so as to have an oblique downward gradient (inclination) to both the surface to be processed 2a of the Si wafer 2 and the inner rim 14a of the film forming ring 13. The equipotential surface is generated to extend beneath the surface to be processed 2a from above the surface to be processed 2a of the Si wafer 2 in the vicinity of the edge area of the Si wafer 2. Further, the equipotential surface passes while converging near the edge area of the Si wafer 2 when going down to a position lower than the surface to be processed 2a from the vicinity of the surface to be processed 2a of the Si wafer 2. That is, near the surface to be processed 2a of the Si wafer 2, an electric field is formed such that the interval of equipotential surfaces may be dense near the edge area of the Si wafer 2.

In this way, when the inner rim 14a of the film forming ring 13 extended downward substantially vertically toward the surface to be processed 2a of the Si wafer 2, an electric field is formed near the edge area of the Si wafer 2 downward from above the surface to be processed 2a of the Si wafer 2 to beneath the surface to be processed 2a along the surface of the Si wafer 2. The material gas in the plasma state enters the electric field (equipotential surface) from a substantially vertical direction. At the same time, the material gas in the plasma state is attracted forcibly from a rough region in interval between equipotential surfaces toward a dense region in interval between equipotential surfaces. Therefore, by using the film forming ring 13, the material gas in the plasma state is attracted to the inner side (central side) in the radial direction of the Si wafer 2, from the outer side (edge side) in the radial direction of the Si wafer 2, in the vicinity of the edge area of the Si wafer 2. Herein, the electric field component (force) of attracting the material gas in the plasma state from the outer side in the radial direction of the Si wafer 2 toward the inner side in the radial direction is called an inward component. On the other hand, the electric field component (force) of attracting the material gas in the plasma state from the inner side in the radial direction of the Si wafer 2 toward the outer side in the radial direction is called an outward component.

The inward component of the electric field generated near the edge area of the Si wafer 2 by using the film forming ring 13 is in the reverse direction to the outward component of the electric field generated near the edge area of the Si wafer 2 when using the conventional focus ring. Therefore, by generating inward components of the electric field, outward components of the electric field can be substantially suppressed (relaxed). That is, the film forming ring 13 is used to generate the electric field such that the attracting force of the material gas in the plasma state to the inner side in the radial direction of the Si wafer 2 is substantially increased near the edge area of the Si wafer 2. This makes it possible to, in the vicinity of the edge area of the Si wafer 2, reduce the force of injecting the material gas in the plasma state from the central side of the Si wafer 2 toward the edge side obliquely from above the surface to be processed 2a. As a result, at the edge area of the Si wafer 2, the material gas in the plasma state can be supplied to the surface to be processed 2a of the Si wafer 2 from above along the normal direction of the surface to be processed 2a. Consequently, regardless of the position on the surface to be processed 2a of the Si wafer 2, the material gas in the plasma state can be applied to the surface to be processed 2a from above along the normal direction of the surface to be processed 2a.

Along with increase in inward components of the electric field, outward components of the electric field can be decreased further. Preferably, the film forming ring 13 should be formed such that the inward component of the electric field in a magnitude capable of mutually canceling with the outward component of the electric field is generated near the edge area of the Si wafer 2. This makes it possible to cancel the inward component of the electric field and the outward component of the electric field each other near the edge area of the Si wafer 2, and to substantially eliminate the components of the electric field for attracting the material gas in the plasma state in the radial direction of the Si wafer 2. As a result, regardless of the position on the surface to be processed 2a of the Si wafer 2, the material gas in the plasma state can be injected into the surface layer of the Si wafer 2 or the recess (not shown) provided on the Si wafer 2, from a direction along the normal direction of the surface to be processed 2a. Specifically, as indicated by solid arrow in FIG. 2, near the edge area of the Si wafer 2, the material gas (component) of the ionized $SiO_2$ thin film in the plasma state can reach up to the bottom of the recess or the like from a direction nearly vertical to the surface to be processed 2a.

As explained herein, according to the first embodiment, it is possible to generate an electric field near the edge area of the wafer (semiconductor substrate) 2, toward a lower position than the surface to be processed 2a of the wafer 2 so as to be directed in a vertical direction from a direction parallel to the surface to be processed 2a of the wafer 2. Hence, regardless of the position on the wafer 2, components of the ionized material gas (film forming material) in the plasma state are supplied into the wafer 2 from a direction substantially vertical to the surface to be processed 2a of the wafer 2, thereby improving the burying characteristic in film forming process. As a result, fine STI (recess) of high aspect ratio, which was impossible to be buried by conventional HDP film forming, can be buried with a thin film without allowing voids. That is, a fine recess of high aspect ratio formed in the wafer 2 or on the wafer 2 can be buried easily, substantially without allowing gaps, regardless of the formation position. A semiconductor device (not shown) to be manufactured by using the film forming ring 13, the semiconductor device manufacturing apparatus 1, or the method of manufacturing a semiconductor device of the embodiment comprises a semiconductor substrate subjected to the film forming process using a material gas in the plasma state enhanced in the burying characteristic of film forming process. Therefore, the semiconductor device of the embodiment is enhanced in its quality, performance, and yield.

(Second Embodiment)

Figure 4:
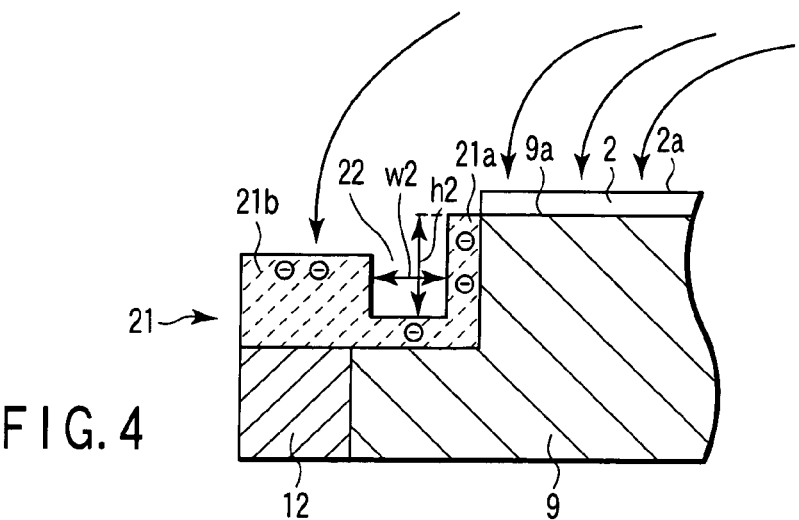
FIG. 4 is an enlarged sectional view showing a film forming ring and an edge area of a semiconductor substrate of a semiconductor device manufacturing apparatus according to a second embodiment of the invention.

A second embodiment of the invention will be described by referring to FIG. 4. FIG. 4 is an enlarged sectional view showing a film forming ring and an edge area of a semiconductor substrate of a semiconductor device manufacturing apparatus according to the embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 4, the film forming ring (ring main body) 21 of the embodiment is formed with the upper surface of its outer rim 21b slightly lower than the upper surface of its inner rim 21a. At the same time, between the inner rim 21a and the outer rim 21b of the ring main body 21, a first recess 22 with height of h2 and width of w2 is formed, the first recess 22 being substantially recessed from the upper surface of the inner rim 21a of the ring main body 21.

For example, the height h2 of the first recess 22 is about 6 mm, and the width w2 thereof is about 12 mm. The film forming ring 21 having such a shape is used together with the HDP-CVD apparatus. Thus, as indicated by solid arrow in FIG. 4, the material gas of the ionized silicone oxide film ($SiO_2$ thin film) in the plasma state can be supplied to the surface to be processed 2a of the Si wafer 2 from the substantially vertical direction.

An apparatus and method for manufacturing a semiconductor device, and a semiconductor device of the embodiment are same as the apparatus and method for manufacturing a semiconductor device, and the semiconductor device of the first embodiment, and their description is omitted.

As explained herein, according to the second embodiment, the same effects as in the first embodiment may be obtained as indicated by solid arrow in FIG. 4. That is, when burying the recess in the Si wafer 2 by forming a $SiO_2$ thin film by using the HDP-CVD apparatus, the film forming ring 21 is used to suppress the force (ion oblique component) of injecting the material gas in the plasma state obliquely from above to the surface to be processed 2a, from the central side to the edge area side of the Si wafer 2. Hence, regardless of the position on the Si wafer 2, the material gas in the plasma state can be supplied to the Si wafer 2 from a direction substantially vertical to the surface to be processed 2a of the Si wafer 2, thereby improving the burying characteristic in film forming process. As a result, the fine recess of high aspect ratio formed in the surface layer of the wafer 2 or on the Si wafer 2 can be buried easily with the $SiO_2$ thin film, substantially without allowing gaps, regardless of the formation position.

(Third Embodiment)

Figure 5:
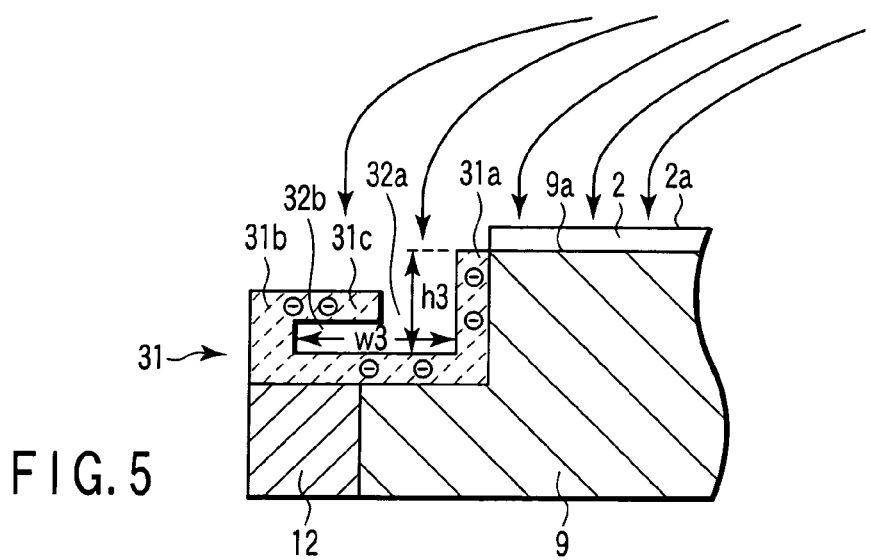
FIG. 5 is an enlarged sectional view showing a film forming ring and an edge area of a semiconductor substrate of a semiconductor device manufacturing apparatus according to a third embodiment of the invention.
Figure 6:
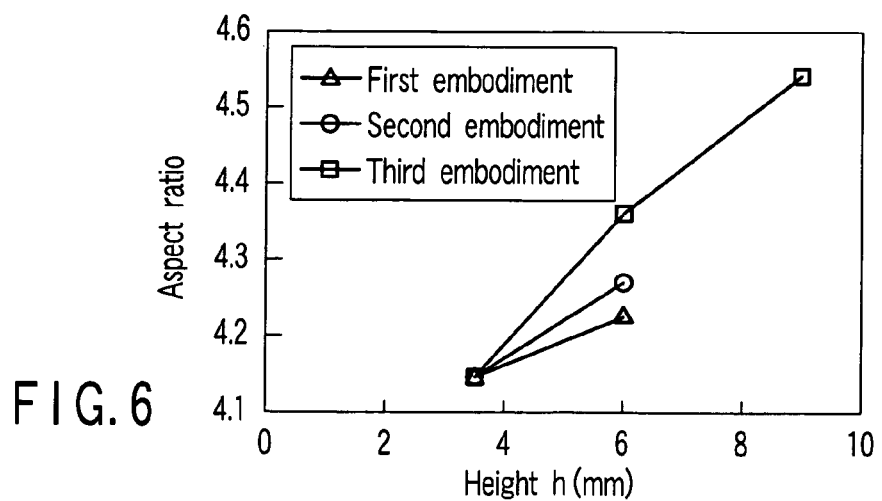
FIG. 6 is a graph showing burying characteristic of a recess by the semiconductor device manufacturing apparatus according to the first to third embodiments.
Figure 7:
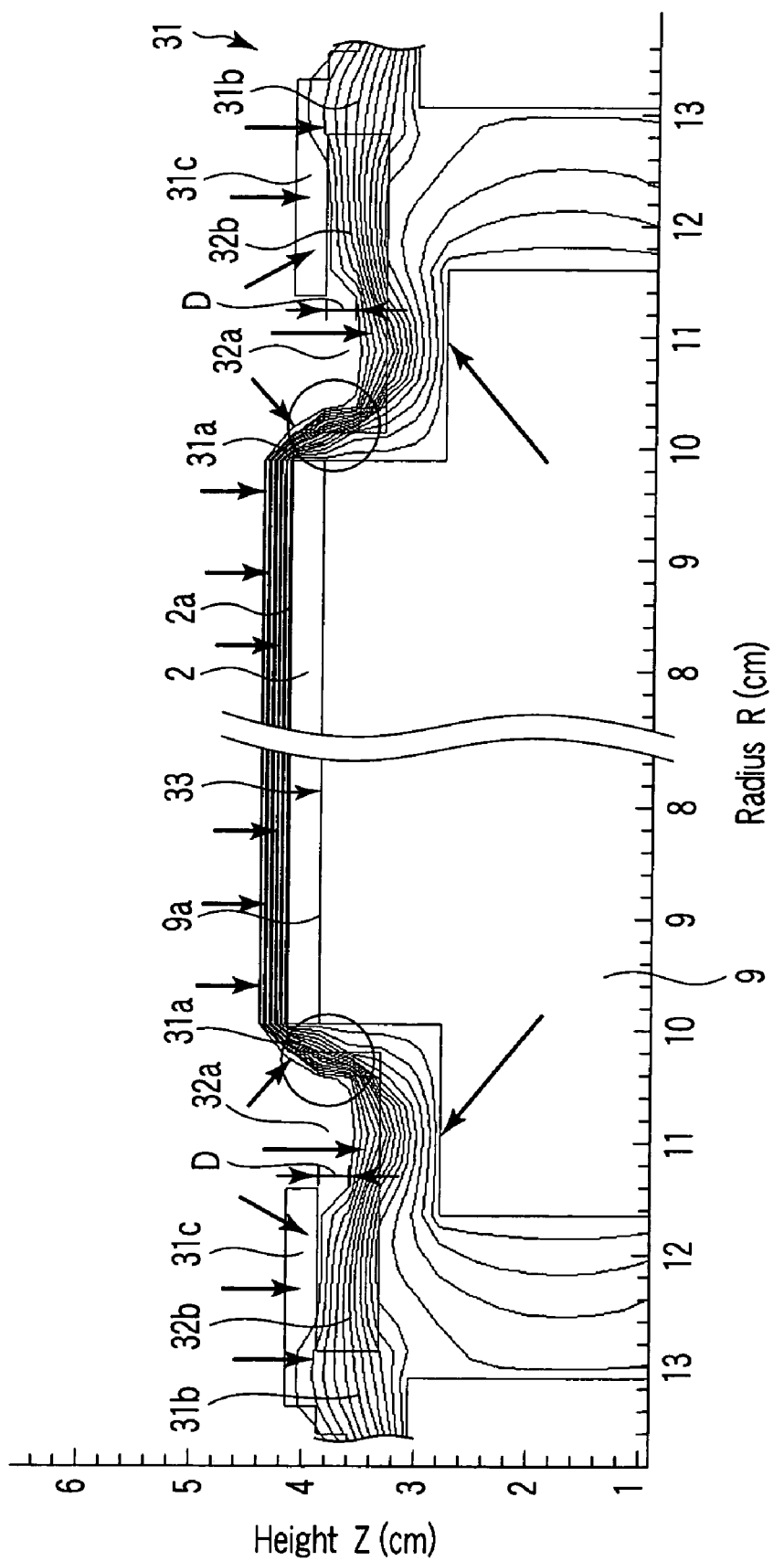
FIG. 7 is a simplified sectional view showing results obtained by simulating an electric field occurring in the film forming ring and the edge area of the semiconductor substrate of the semiconductor device manufacturing apparatus according to the third embodiment.

A third embodiment of the invention will be described by referring to FIGS. 5 to 7. FIG. 5 is an enlarged sectional view showing a film forming ring and an edge area of a semiconductor substrate of a semiconductor device manufacturing apparatus according to the embodiment. FIG. 6 is a graph showing burying characteristic of a recess by the semiconductor device manufacturing apparatus according to the first to third embodiments. FIG. 7 is a simplified sectional view showing results obtained by simulating an electric field occurring in the film forming ring and edge area of the semiconductor substrate of the semiconductor device manufacturing apparatus according to this embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 5, the film forming ring (ring main body) 31 of the embodiment is formed with the upper surface of its outer rim 31b at a height equal to or lower than the upper surface of its inner rim 31a. At the same time, the upper portion of the outer rim 31b is extended toward the inner side in the radial direction from the outer side in the radial direction of the film forming ring 31. However, the upper portion of the outer rim 31b does not contact with the inner rim 31a. In the following explanation, the upper portion of the outer rim 31b of the film forming ring 31 is called an overhang portion 31c.

At the outer side of the inner rim 31a of the ring main body 31, a first recess 32a with height of h3 is formed, the first recess 32a being substantially recessed from the upper surface of the inner rim 31a of the ring main body 31, same as the film forming ring 21 of the second embodiment. At the same time, at the outer side of the inner rim 31a of the ring main body 31, a second recess 32b of width (depth) of w3 which communicates with the bottom of the first recess 32a is formed toward the radial outer side (outer rim 31b) of the ring main body 31. For example, the height h3 of the first recess 32a is set at about 6 mm, and the width w3 of the second recess 32b about 24 mm.

FIG. 7 shows results obtained by simulating an electric field occurring in the film forming ring 31 and near the Si wafer 2 when the film forming ring 31 of the embodiment is used together with an HDP-CVD apparatus 33. According to FIG. 7, by using the film forming ring 31 of the embodiment, same as when using the film forming ring 13 of the first embodiment and the film forming ring 21 of the second embodiment, it is known that equipotential surfaces can be generated so as to pass near the surface to be processed 2a of the Si wafer 2, and near the surface and inside of the inner rim 31a of the film forming ring 31. When the film forming ring 31 is used, it is also known that the electric field (equipotential surface) is concentrated in an area indicated by solid arrow in FIG. 7. In the embodiment, different from the first and second embodiments, it is known that the equipotential surfaces are concentrated in the first recess 32a and second recess 32b. It is thus learned that equipotential surfaces are concentrated in a space low in dielectric constant. Accordingly, the equipotential surfaces are inclined obliquely downward so as to move to the bottom of the first recess 32a from above the surface to be processed 2a of the Si wafer 2 in the vicinity of the inner rim 31a of the film forming ring 31 as indicated by solid line circle in FIG. 7, and pass near the edge area of the Si wafer 2. At this time, the equipotential surfaces pass while converging near the edge area of the Si wafer 2.

Thus, equipotential surfaces generated near the Si wafer 2 and the film forming ring 31 are pulled down to the downside of the surface to be processed 2a of the Si wafer 2 by the first recess 32a. The equipotential surfaces pulled down to the position lower than the surface to be processed 2a by the first recess 32a are held at the height by the second recess 32b up to a position far from the inner rim 31a of the film forming ring 31 from that of the first and second embodiments. Specifically, the equipotential surfaces converged near the bottom of the first recess 32a are held at a height equal to or lower than the height of the second recess 32b until passing through the second recess 32b. At the same time, at least from the center part of the first recess 32a to the inlet of the second recess 32b, the equipotential surfaces are further lowered by an interval (height) D indicated by the solid arrow in FIG. 7 from the downside of the overhang 31c of the film forming ring 31. Accordingly, near the edge area of the Si wafer 2, an electric field is formed in which the interval of equipotential surfaces is narrower than the interval of equipotential surfaces in the first and second embodiments. That is, it is possible to generate, near the edge area of the Si wafer 2, an electric field increased in the inward components of the electric field. Thus, by increasing inward components of the electric field near the edge area of the Si wafer 2, outward components of the electric field can be decreased. As a result, it is more effective to suppress the force (ion oblique component) of incidence of the material gas in the plasma state obliquely from above the surface to be processed 2a from the central side to the edge side of the Si wafer 2.

FIG. 6 shows results of experiment of burying characteristic of a recess conducted by the present inventors. This experiment is intended to investigate the relation between the height h of the inner rims 14a, 21s, 31a of the film forming rings 13, 21, 31 and the aspect ratio of the recess that can be buried, in the case of using the film forming rings 13, 21, 31 of the first to third embodiments together with the HDP-CVD apparatus. The graph shows the dependence of the aspect ratio of the recess that could be buried by the HDP-CVD apparatus using the film forming rings 13, 21, 31, on the distance between the recess (trench) and the surface to be processed 2a of the Si wafer 2. According to FIG. 6, when the height h of the inner rims 14a, 21a, 31a of the film forming rings 13, 21, 31 was about 3.5 mm which is same as the height h1 of the inner rim 14a of the film forming ring 13 in the first embodiment, the aspect ratio of the recess that can be buried substantially without allowing voids was about 4.15 in all of the film forming rings 13, 21, 31.

When the height h of the inner rims 14a, 21a, 31a of the film forming rings 13, 21, 31 was about 6 mm which is same as the heights h2, h3 of the inner rims 14a, 21a of the film forming rings 13, 21 in the second and third embodiments, the aspect ratio of the recess that could be buried substantially without allowing voids was different among the film forming rings 13, 21, 31. Specifically, the aspect ratio of the recess that could can be buried substantially without allowing voids by the film forming ring 13 in the first embodiment was about 4.23. By contrast, the aspect ratio of the recess that could be buried substantially without allowing voids by the film forming ring 21 in the second embodiment was about 4.27. Further, the aspect ratio of the recess that could be buried substantially without allowing voids by the film forming ring 31 in the third embodiment was about 4.37. Thus, by setting the height h of the inner rims 14a, 21a, 31a of the film forming rings 13, 21, 31 at about 6 mm, it has been known that the recess with the aspect ratio of about 4.2, which was almost impossible hitherto, could be buried substantially without voids. As compared with the film forming ring 13 of the first embodiment, it is also known that the burying characteristic is higher in the film forming ring 21 of the second embodiment. Similarly, as compared with the film forming ring 21 of the second embodiment, it is known that the burying characteristic is higher in the film forming ring 31 of the third embodiment. In this case, the height h1 of the inner rim 14a of the film forming ring 13 of the first embodiment is about $\frac{1}{7}$ or more of the width w1.

When the height h of the inner rim 31a of the film forming ring 31 of the third embodiment was about 9 mm, the aspect ratio of the recess that could be buried substantially without voids was about 4.55. That is, as compared with the case where the height h of the inner rims 14a, 21a, 31a of the film forming rings 13, 21, 31 was about 3.5, the aspect ratio of the recess that could be buried substantially without voids could be heightened by about 10 percents. That is, when the height h of the inner rim 31a of the film forming ring 31 of the third embodiment was set at about 9 mm, the aspect ratio of the recess that could be buried substantially without voids was extremely heightened.

An apparatus and method for manufacturing a semiconductor device, and a semiconductor device of the embodiment are same as the apparatus and method for manufacturing a semiconductor device, and the semiconductor device of the first embodiment, and their description is omitted.

As described herein, according to the third embodiment, as indicated by solid arrow in FIG. 5, the same effects as in the first and second embodiments can be obtained. Moreover, by setting the height h of the inner rim 31a of the film forming ring 31 at about 6 mm or more, the burying characteristic is further enhanced, and a recess of an extremely high aspect ratio can be buried.

(Fourth Embodiment)

Figure 8:
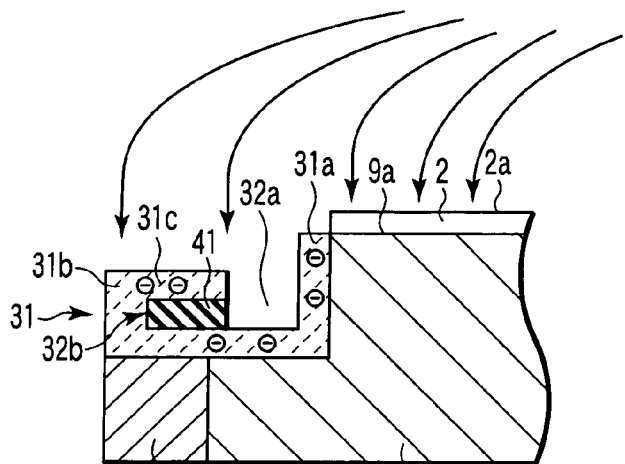
FIG. 8 is an enlarged sectional view showing a film forming ring and an edge area of a semiconductor substrate of a semiconductor device manufacturing apparatus according to a fourth embodiment of the invention.

A fourth embodiment of the invention will be described by referring to FIG. 8. FIG. 8 is an enlarged sectional view showing a film forming ring and an edge area of a semiconductor substrate of a semiconductor device manufacturing apparatus according to the embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 8, this embodiment uses the film forming ring (ring main body) 31 of the third embodiment. Besides, a low dielectric substance 41 of lower dielectric constant than the ceramic is provided in the second recess 32b. As a result, the electric field generated around the Si wafer 2 and near the film forming ring 31 can be passed easily into the inside of the low dielectric substance 41, that is, the second recess 32b.

Examples of the material of the low dielectric substance 41 used in the embodiment include: insulating materials mainly composed of Si, such as $SiO_2$, SiN and SiON; ceramics or porous ceramics mainly composed of $Al_2O_3$; ceramics or porous ceramics mainly composed of $Al_2O_3$ and $SiO_2$; ceramics or porous ceramics mainly composed of MgO, $Al_2O_3$, and $SiO_2$; ceramics or porous ceramics mainly composed of MgO and $SiO_2$; P—BN insulating materials; fluorocarbon resins such as PTFE; and other materials having the same low dielectric constant and properties as the materials listed above.

An apparatus and method for manufacturing a semiconductor device, and a semiconductor device of the embodiment are same as the apparatus and method for manufacturing a semiconductor device, and the semiconductor device of the first embodiment, and their description is omitted.

As explained herein, according to the fourth embodiment, the same effects as in the first to third embodiments may be obtained as indicated by solid arrow in FIG. 8. Further, in the embodiment, the second recess 32b is provided outside of the first recess 32a provided in the film forming ring 31, and the low dielectric substance 41 is provided in the second recess 32b. Therefore, the equipotential surface pulled down to the downside from the surface to be processed 2a of the wafer 2 by the first recess 32a is substantially passed by force into the low dielectric substance 41 enclosed between the ceramic material and another ceramic material. Consequently, the oblique components of ions are further suppressed, and the burying characteristic can be further improved. Same as in the third embodiment, a recess of an extremely high aspect ratio can be buried.

(Fifth Embodiment)

Figure 9:
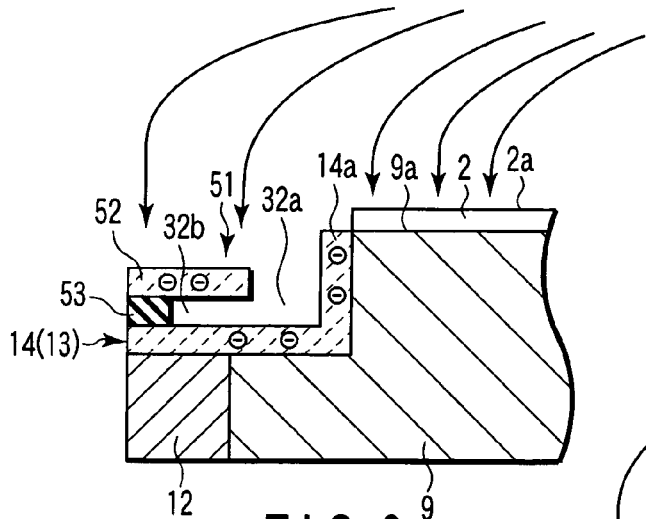
FIG. 9 is an enlarged sectional view showing a film forming ring and an edge area of a semiconductor substrate of a semiconductor device manufacturing apparatus according to a fifth embodiment of the invention.

A fifth embodiment of the invention will be described by referring to FIG. 9. FIG. 9 is an enlarged sectional view showing a film forming ring and an edge area of a semiconductor substrate of a semiconductor device manufacturing apparatus according to the embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 9, a film forming ring 51 of the embodiment is composed by a combination of the film forming ring 13 in the first embodiment and an auxiliary ring 52. The auxiliary ring 52 is formed of an insulating material in an annular shape surrounding the inner rim 14a of the ring main body 14 from its outside. The auxiliary ring 52 is apart from the upper surface of the outside portion of the inner rim 14a of the ring main body 14, and is arranged at a height equal to or lower than the upper surface of the inner rim 14a of the ring main body 14. In this embodiment, the auxiliary ring 52 is made of ceramic same as the ring main body 14.

Further, a low dielectric substance 53 of lower dielectric constant than the ceramic is provided at least between the lower surface of the outer rim of the auxiliary ring 52 and the upper surface of the outer rim of the ring main body 14. That is, on the outer rim of the film forming ring 51, the low dielectric substance 53 is provided between the ring main body 14 and the auxiliary ring 52. In this embodiment, however, the low dielectric substance 53 is provided to cover part of the radial outer side of the lower surface of the auxiliary ring 52. As a result, same as in the third embodiment, the first recess 32a and second recess 32b are provided in the film forming ring 51 substantially by the ring main body 14, auxiliary ring 52, and low dielectric substance 53. The material of the low dielectric substance 53 may be same as the material of the low dielectric substance 41 used in the fourth embodiment described above.

As explained herein, according to the fifth embodiment, the same effects as in the first to fourth embodiments may be obtained as indicated by solid arrow in FIG. 9. Further, by varying the thickness of the low dielectric substance 53, the height of the auxiliary ring 52 and second recess 32b can be properly set to an appropriate position easily. At the same time, by varying the width of the low dielectric substance 53, the depth of the second recess 32b can be properly set to an appropriate position easily. This makes it possible to properly set the burying characteristic in an appropriate state easily, depending on the size and shape of the recess to be buried and the aspect ratio. Hence, the burying characteristic can be further improved.

(Sixth Embodiment)

Figure 10:
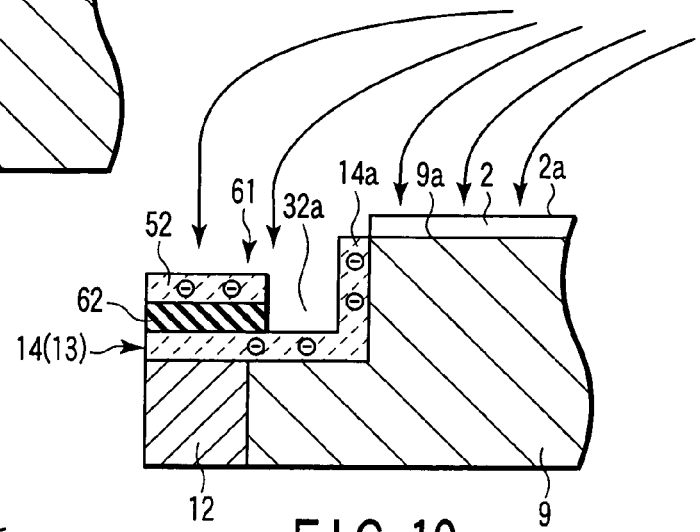
FIG. 10 is an enlarged sectional view showing a film forming ring and an edge area of a semiconductor substrate of a semiconductor device manufacturing apparatus according to a sixth embodiment of the invention.

A sixth embodiment of the invention will be described by referring to FIG. 10. FIG. 10 is an enlarged sectional view showing a film forming ring and an edge area of a semiconductor substrate of a semiconductor device manufacturing apparatus according to the embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 10, a film forming ring 61 of the embodiment is composed by a combination of the film forming ring 13 in the first embodiment and the auxiliary ring 52 in the fifth embodiment. However, a low dielectric substance 62 of lower dielectric constant than the ceramic is provided to cover the entire surface of the lower surface of the auxiliary ring 52, between the lower surface of the outer rim of the auxiliary ring 52 and the upper surface of the outer rim of the ring main body 14. As a result, unlike the fifth embodiment, the film forming ring 61 is completely plugged in the second recess (not shown) by the low dielectric substance 62, and only the first recess 32a is provided substantially. The material of the low dielectric substance 62 may be same as the materials of the low dielectric substance 41 used in the fourth embodiment and the low dielectric substance 53 used in the fifth embodiment described above.

An apparatus and method for manufacturing a semiconductor device, and a semiconductor device of the embodiment are same as the apparatus and method for manufacturing a semiconductor device and the semiconductor device of the first embodiment, and their description is omitted.

As explained herein, according to the sixth embodiment, the same effects as in the first to fifth embodiments may be obtained as indicated by solid arrow in FIG. 10. Further, by forming the low dielectric substance 62 in the entire area between the lower surface of the auxiliary ring 52 and the upper surface of the outside portion of the inner rim 14a of the ring main body 14, the electric field can be passed inside the low dielectric substance 62 more aggressively than in the fifth embodiment. As a result, the burying characteristic can be further improved.

(Seventh Embodiment)

Figure 11:
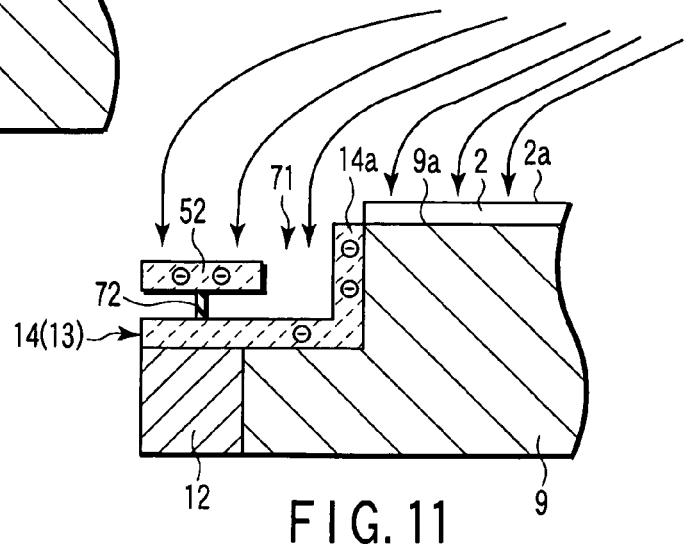
FIG. 11 is an enlarged sectional view showing a film forming ring and an edge area of a semiconductor substrate of a semiconductor device manufacturing apparatus according to a seventh embodiment of the invention.

A seventh embodiment of the invention will be described by referring to FIG. 11. FIG. 11 is an enlarged sectional view showing a film forming ring and an edge area of a semiconductor substrate of a semiconductor device manufacturing apparatus according to the embodiment. Same parts as in the first embodiment are identified with same reference numerals, and detailed description is omitted.

This embodiment is similar to the first embodiment except that the shape of its film forming ring is different from that of the film forming ring 13. This is specifically described below.

As shown in FIG. 11, a film forming ring 71 of the embodiment is composed by a combination of the film forming ring 13 in the first embodiment and the auxiliary ring 52 in the fifth embodiment. The auxiliary ring 52 is supported by a post 72 as an auxiliary ring supporter provided on the upper surface of the outside portion of the inner rim 14a of the ring main body 14. Thus, it is apart from the upper surface of the outside portion of the inner rim 14a of the ring main body 14.

An apparatus and method for manufacturing a semiconductor device, and a semiconductor device of the embodiment are same as the apparatus and method for manufacturing a semiconductor device, and the semiconductor device of the first embodiment, and their description is omitted.

As explained herein, according to the seventh embodiment, the same effects as in the first to sixth embodiments may be obtained as indicated by solid arrow in FIG. 11. That is, the electric field (equipotential surface) lowered from the edge area of the wafer 2 can be guided to pass between the auxiliary ring 52 and the upper surface of the outside portion of the inner rim 14a of the ring main body 14. Besides, by varying the height of the post 72, the height of the auxiliary ring 52 can be properly set at an appropriate position easily. That is, the occupied region of the space near the ring main body 14 at the outside of the inner rim 14a of the ring main body 14 can be properly set in an appropriate size easily. Hence, the burying characteristic can be properly set in an appropriate state easily depending on the size and shape of the recess to be buried and the aspect ratio. As a result, the burying characteristic can be further improved.

The film forming ring and the method for manufacturing a semiconductor device of the invention are not limited to the first to seventh embodiments alone. The construction or manufacturing process may be partly changed or modified variously in a range not departing from the true spirit of the invention, or various settings may be properly combined and arranged.

For example, the forming material of the film forming ring 13 (ring main body 14) and auxiliary ring 52 is not limited to ceramics alone. As shown in the first to seventh embodiments, any material may be used as far as the electric field can be lowered toward a position lower than the surface to be processed 2a of the wafer 2 near the edge area of the wafer 2. The size and shape of the film forming ring 13 (ring main body 14) and auxiliary ring 52 may be properly set in appropriate size or shape so as to obtain a desired burying characteristic depending on the size and shape of the wafer 2, position and size of the recess to be buried, or aspect ratio. Similarly, the position and shape of the low dielectric substances 41, 53, 62 and the post 72 may be properly set in appropriate size or shape so as to obtain a desired burying characteristic depending on the size and shape of the wafer 2, position and size of the recess to be buried, or aspect ratio.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming ring comprising:
 a ring main body being made of an insulating material and formed in an annular shape along an edge of a substrate on which a film forming process by using a material gas in a plasma state is applied, and an inner rim of the ring main body being formed higher than its outside portion.

2. A film forming ring according to claim 1, wherein the inner rim is extended and formed along a direction orthogonal to a principal surface of a side of the substrate on which the film forming process is applied.

3. A film forming ring according to claim 1, wherein the ring main body is made of ceramics.

4. A film forming ring according to claim 1, further comprising:
 a first recess dented from an upper surface of the inner rim of the ring main body, the first recess being formed in the outside portion of the ring main body.

5. A film forming ring according to claim 1, further comprising:
 an auxiliary ring, the auxiliary ring being made of an insulating material and formed in an annular shape surrounding the inner rim of the ring main body from its outside portion; and
 being spaced from an upper surface of the outside portion of the ring main body, and arranged at a height equal to or lower than the upper surface of the inner rim of the ring main body.

6. A film forming ring according to claim 1, wherein the inner rim of the ring main body is formed higher than its outside portion by 6 mm or more.

7. A film forming ring according to claim 1, wherein a height of the inner rim of the ring main body is ½ or more of a width along a radial direction of the ring main body in the outside portion of the ring main body.

8. A film forming ring according to claim 4, further comprising:
 a second recess which communicates with the first recess, the second recess being formed in the outside portion of the ring main body from the first recess toward the outside in a radial direction of the ring main body.

9. A film forming ring according to claim 5, wherein the auxiliary ring is made of ceramics.

10. A film forming ring according to claim 5, further comprising:
 a low dielectric substance of lower dielectric constant than ceramic, the low dielectric substance being arranged at least between a lower surface of an outer rim of the auxiliary ring and an upper surface of an outer rim of the ring main body.

11. A film forming ring according to claim 5, further comprising:
a low dielectric substance of lower dielectric constant than ceramic, the low dielectric substance being arranged in an entire area between a lower surface of the auxiliary ring and the upper surface of the outside portion of the ring main body.

12. A film forming ring according to claim 5, wherein the auxiliary ring is supported above the ring main body by an auxiliary ring supporter provided on the upper surface of the outside portion of the ring main body.

13. A film forming ring according to claim 8, further comprising:
a low dielectric substance of lower dielectric constant than ceramic, the low dielectric substance being arranged in the second recess.

14. A method of manufacturing a semiconductor device comprising:
arranging a semiconductor substrate on which a film forming process by using a material gas in a plasma state is applied on a substrate supporter provided in a processing container, and mounting a film forming ring so as to be set an inner rim of a ring main body of the film forming ring being along an edge of the semiconductor substrate and an upper surface of the inner rim being positioned at a height equal to or lower than a principal plane of a side of the semiconductor substrate on which the film forming process is applied;
supplying the material gas for use in the film forming process into the processing container; and
generating the plasma state of the material gas in the processing container by applying a voltage to the material gas supplied in the processing container;
wherein the ring main body is made of an insulating material and formed in an annular shape along the edge of the semiconductor substrate, and the inner rim is formed higher than its outside portion.

15. A method of manufacturing a semiconductor device according to claim 14, wherein the film forming ring comprises a first recess dented from an upper surface of the inner rim of the ring main body, the first recess being formed in the outside portion of the ring main body.

16. A method of manufacturing a semiconductor device according to claim 14, wherein the film forming ring comprises an auxiliary ring, the auxiliary ring being made of an insulating material and formed in an annular shape surrounding the inner rim of the ring main body from its outside; and being spaced from an upper surface of the outside portion of the ring main body, and arranged at a height equal to or lower than the upper surface of the inner rim of the ring main body.

17. A method of manufacturing a semiconductor device according to claim 14, wherein the film forming process includes burying a recess formed in the substrate or above the substrate with a film.

* * * * *